United States Patent [19]
Kirsch

[11] Patent Number: 5,987,239
[45] Date of Patent: Nov. 16, 1999

[54] COMPUTER SYSTEM AND METHOD FOR BUILDING A HARDWARE DESCRIPTION LANGUAGE REPRESENTATION OF CONTROL LOGIC FOR A COMPLEX DIGITAL SYSTEM

[75] Inventor: Graham Kirsch, Tadley, United Kingdom

[73] Assignee: LSI Logic Corporation, Milpitas, Calif.

[21] Appl. No.: 08/766,650

[22] Filed: Dec. 13, 1996

[51] Int. Cl.⁶ .................................................. G06F 17/50
[52] U.S. Cl. ........................................................ 395/500.02
[58] Field of Search ................................... 364/488, 489; 395/500.02, 500.03, 500.11, 500.19

[56] References Cited

U.S. PATENT DOCUMENTS

| | | | |
|---|---|---|---|
| 5,555,201 | 9/1996 | Dangelo et al. | 364/489 |
| 5,684,808 | 11/1997 | Valind | 371/22.3 |

*Primary Examiner*—Kevin J. Teska
*Assistant Examiner*—Thuan Do

[57] ABSTRACT

A computer system and method for generating a hardware description language source code file with embedded microcode segments for describing control logic of a complex digital system. A macro file is defined, comprising source code written in the hardware description language and a macro name associated with a segment of the source microcode in the macro file. A skeleton file is defined, comprising source code written in the hardware description language and including a reference to the macro name. The skeleton file is combined with the segment of the source microcode from the macro file at the reference to the macro name using a preprocessor to form a final source code file. Preferably, each microcode segment is encapsulated between a pair of comment statements expressed in the hardware description language. The comment statements identify macro names that are used for specifying a location within a hardware description language source code file at which the encapsulated microcode statement will be instantiated. This protocol enables the designer to preserve the attributes of the microcode while using the advantages of a hardware description language programming framework.

24 Claims, 5 Drawing Sheets

COMPUTER SYSTEM AND METHOD FOR BUILDING A HARDWARE DESCRIPTION LANGUAGE REPRESENTATION OF CONTROL LOGIC FOR A COMPLEX DIGITAL SYSTEM

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

This invention relates generally to complex digital system design and more particularly to building a hardware description language representation of control logic for a complex digital system.

The behavior of electronic digital circuitry is dictated by control logic. The control logic in a simple digital system, such as a counter, can be mathematically defined and is relatively straightforward to design. Conversely, the control logic in a complex digital system, such as a microprocessor, must express a multitude of finite logic states and the amount of information conveyed is often too extensive for a human designer to comfortably comprehend. Consequently, computer-assisted design tools are often used to assist with the control logic design for complex digital systems and can also be used to simulate and test the intended behavior of the digital circuitry prior to actual synthesis into an integrated circuit.

One method of control logic design involves expressing the control logic as microcode which is burned or programmed into a read-only memory device, a gate array, a programmable logic device or similar logic block. During use of such a device, an address is input to the microcoded logic block which outputs the contents stored at that address, or a function of those contents, as control signals. Due to its similarity to a traditional computer program, microcode is easy to define and maintain. However, microcode is difficult to simulate and test using the computer-assisted design tools and is hard to synthesize into compact and fast logic blocks.

Another method of control logic design involves describing the control logic in a hardware description language, such as the Very High Speed Integrated Circuits Hardware Description Language (VHDL). With this design method, the structure and behavior of the circuit are specified in a source code file written in a hardware description language. The control logic can then be simulated and tested using the appropriate software packages and can be automatically synthesized into an electronic circuit. However, large control blocks, such as for microprocessor control, require a lengthy source code file and often contain a large amount of repeated code. The size of the source code file and the degree of code repetition make it difficult to maintain and develop complex digital systems using this method.

Therefore, there is a need for an apparatus and method for facilitating control logic design for a complex digital system using a hardware description language representation while avoiding the creation of a single monolithic hardware description language source code file containing repetitious segments of microcode.

SUMMARY OF THE INVENTION

It is, therefore, an object of the present invention to simplify the computer-aided design of digital logic circuitry, thereby avoiding the drawbacks of conventional microcode and circuit design by using a hardware description language. According to the invention, this is accomplished by encapsulating and manipulating microcode segments in a hardware description language format and by shortening the length and simplifying the structure of the hardware description language source code files used in specifying the control logic of the complex digital system.

The invention is a computer system and method for building a hardware description language representation of control logic for a complex digital system. A segment of microcode for expressing an operation performed by the complex digital system is represented in hardware description language source code. A macro definition is constructed by associating a macro name with the segment of microcode and stored in a macro file in the computer system. An interface to the complex digital system and a structure for the control logic for the complex digital system, including a reference to the macro name, are represented in hardware description language source code and stored in a skeleton file in the computer system. A final output file is formed by locating the reference to the macro name, obtaining the macro definition and replacing the macro name with the segment of microcode and stored in the computer system.

Using this computer system and method, an existing, production complex digital system has been completely redesigned by a team of designers with less experience and half the number as the original design team but in half of the time.

Preferably, each microcode segment is encapsulated between a pair of comment statements expressed in the hardware description language. The comment statements identify macro names that are used for specifying a location within a hardware description language source code file at which the encapsulated microcode statement will be instantiated. This protocol enables the designer to preserve the attributes of the microcode while using the advantages of a hardware description language programming framework.

The foregoing and other objects, features and advantages of the invention will become more readily apparent from the following detailed description of a preferred embodiment of the invention which proceeds with reference to the accompanying drawings.

The APPENDIX is a listing of pertinent portions of code for a preprocessor program for use in implementing the present invention.

DETAILED DESCRIPTION

Figure 1:
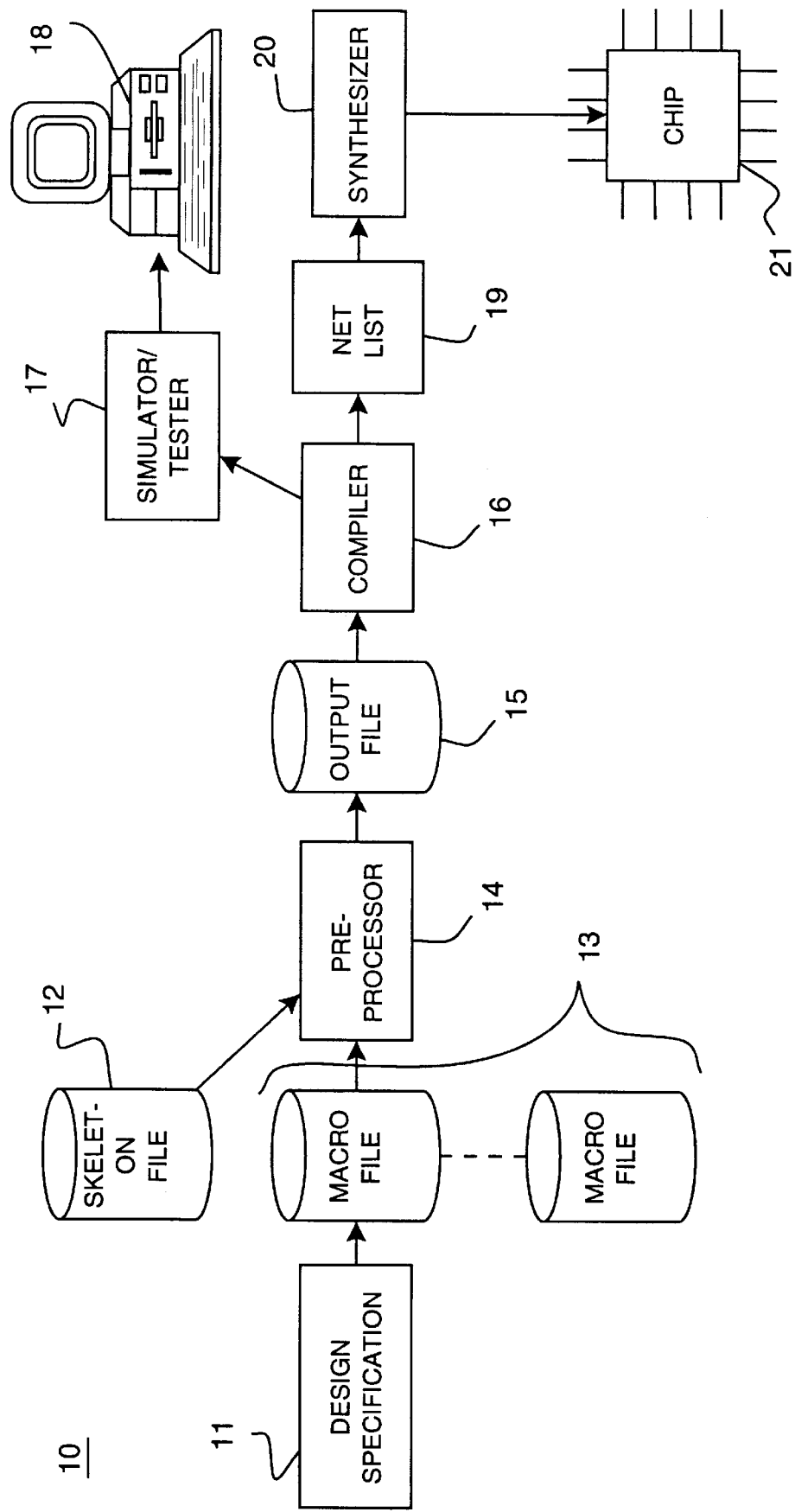
FIG. 1 is a functional block diagram showing a computer system for designing control logic for a complex digital system represented in a hardware description language and constructed in accordance with the present invention.

Referring to FIG. 1, a functional block diagram of a computer system 10 for designing control logic for a complex digital system represented in a hardware description language, constructed in accordance with the present invention, is shown. An example of a complex digital system is a microprocessor characterized by a very large number of logic gates, representing a large finite state machine, and programmability. A simpler example is a decoder which converts or decodes a logic signal consisting of a small number of binary inputs into a wider control word.

In the described embodiment, a preprocessor 14 is employed and consists of a computer program running on a programmed digital computer system equipped with a central processing unit, a memory for storing hardware description language source code and other files, and a user input and output interface which includes an input device, such as a keyboard, and a display device, such as a monitor. A Sun Workstation, manufactured by Sun Microsystems, Mountain View, Calif., is employed to execute the preprocessor 14, although the preprocessor 14 can be ported to other similarly configured hardware platforms or networks.

In the computer system 10, a design specification 11 for describing the behavioral characteristics and structure of a target complex digital system is drafted by a designer. The design specification 11 breaks down the control logic into smaller blocks for representing individual electronic circuits or subsystems which form a part of the larger electronic system and which control the operation of other electronic subsystems included in the overall target design. The design specification 11 is used as a model for defining a skeleton file 12 and a plurality of macro files 13. These files are source code files expressed in a hardware description language for embodying the design specification 11 in a format usable with computer-assisted design tools. The skeleton file 12 and macro files 13 contain macro instantiations and corresponding macro definitions. A macro instantiation is simply a reference to a macro name located at a place in the source code file at which a segment of prestored microcode is to be substituted. A macro definition associates the macro name with a particular segment of microcode and is possibly stored in a different source code file. The structure of these files, including macro instantiations and macro definitions, is described further below.

A preprocessor 14 combines the skeleton file 12 with one or more of the macro files 13 to form output file 15. The preprocessor 14 processes or conditions the source code before it is passed onto a compiler 16, hence the term preprocessor. The operation of the preprocessor 14 is described with reference to FIG. 3 et seq.

The skeleton file 12, macro files 13 and output file 15 are stored in the memory. The output file 15 is a description of the complete control logic for the complex digital system expressed in a hardware description language with macro instantiations removed by the preprocessor 14. The output file 15 can be reviewed by a designer on a display device on the workstation or computer terminal 18. Alternatively, the output file 15 can be compiled by the hardware description language compiler 16 to generate either an appropriate input format for a simulator/tester 17 or a net list 19 for describing the complex digital system as a series of logic gates. The simulator/tester 17 can be used by the designer to simulate and test the structure and behavior of the complex digital system, the results of which can be viewed on computer terminal 18. Alternatively, a synthesizer 20 can be used by the designer, using the net list 19 as inputs, to create an integrated circuit layout to be used to fabricate an actual physical electronic circuit chip 21.

The design specification 11 is broken down into smaller pieces with the skeleton file 12 generally providing an overall template for the structure of the complex digital system and the macro files 13 containing macro definitions. These are only general guidelines and the actual decision as to where to store structure or macro definitions is up to the designer. However, one design strategy is to collect macros containing segments of microcode for similar functions, such as addition or moves, into a single macro file 13.

Assuming the usual case, the skeleton file 12 is basically a template of the basic construction of the control logic for the complex digital system. For example, the skeleton file 12 for a decoder can be structured as follows:

```
entity DECODER is
    port (
        INSTR    : in bit_vector(7 downto 0);
        MUCODE   : out bit_vector(47 downto 0)
    )
end DECODER;
architecture RTL of DECODER is
-- INSERT MUCODE DEFINITIONS
begin
    DEC_PROC: process(INSTR)
    begin
        -- INSERT MUCODE DEFAULTS
        if INSTR(OP_CODE_RANGE) = OP_CODE then
            if (INSTR(SRC_MODE) = SRC_IMMEDIATE) then
                -- INSERT ADD IMMEDIATE
            elsif (INSTR(SRC_MODE = SRC_REGISTER) then
                -- INSERT ADD REGISTER
            elsif . . .
                .
                .
                .
            end if;
        elsif INSTR(OP_CODE_RANGE) = MOV_OPCODE then
            if . . .
                .
                .
                .
        end if;
    end process DEC_PROC;
end RTL;
```

At a minimum, the skeleton file 12 contains a definition of the interface between the complex digital system and the outside world ("entity DECODER is . . . ") and the body or architecture of the complex digital system ("architecture RTL of DECODER is . . . "). One form of specifying the architecture is to include a conditional statement ("if INSTR (OP_CODE_RANGE) . . . "), sometimes quite lengthy, defining the behavioral characteristics of the complex digital system. In the described embodiment, a conditional statement is compiled using a special compiler for the Very High Speed Integrated Circuits Hardware Description Language (VHDL).

Within the architecture, three sections of code are commonly defined: definitions, defaults and connections. In the present example, these sections are defined using macro instantiations as further explained below, to simplify and shorten the length of the skeleton file 12, thereby making the skeleton file 12 easier to maintain and work with. Alternatively, these sections can be defined as hardware description language source code directly in either the skeleton file 12 or macro files 13. The definitions section ("-- INSERT MUCODE DEFINITIONS") defines microcode fields to which signal values are assigned during the operation of the complex digital system or for reserving memory space or assigning temporary storage for a signal behavior observed during simulation. The defaults section ("-- INSERT MUCODE DEFAULTS") assigns a signal value to each of the microcode fields defined in the definitions section. The default values are used in the event that no signal changes are effected to the microcode fields during the operation of the complex digital system. It is critical that all microcode fields are assigned a default value. The connections section ("-- INSERT MUCODE CONNECTIONS") specifies the logical connections between each of the signals as used during simulation. Each microcode field is "connected" to an outgoing microcode word. It is critical that all microcode fields be specified.

In each of the macro files 13, one or more macro definitions are maintained. Macro definitions can also be maintained in the skeleton file 12, but the main purpose of the macro files 13 is to store macro definitions whereas the skeleton file 12 is primarily for storing a template of the complex digital system's structure. The macro files 13 can be used, for example, to store macro definitions for related control logic operations as instruction groups, such as arithmetic, move, branch and program control, bit manipulation, multiplication or special instruction groups. In addition, one of the macro files 13 can be designated a "master" macro file for storing the macro definitions for the definitions, defaults or connections sections.

The skeleton file 12 and macro files 13 can contain references to macro names for identifying a location in the hardware description language source code at which a segment of microcode will be substituted during preprocessing by the preprocessor 14. Each such macro reference is known as a macro instantiation. As described below and shown in FIG. 3 et seq., the preprocessor 14 first locates a macro instantiation, obtains the associated macro definition from the skeleton file 12 or one of the macro files 13 and outputs the corresponding segment of microcode in place of the macro instantiation to the output file 15. In the described embodiment, a macro instantiation is defined as a VHDL comment and is of the form:

-- INSERT MUCODE macro_name wherein -- INSERT MUCODE macro_name marks a macro instantiation and macro_name is the name of the macro. A similar methodology employing comment statements can be used for other hardware description language implementations. For instance, in Verilog HDL, the leading characters for comments are "//". It is critical that the body of the macro definition substituted in place of the macro instantiation be consistent with the location in the hardware description language source code into which it is substituted. For instance, the use of undefined microcode fields must be avoided.

A macro definition consists of a macro name associated with a segment of microcode. Macro definitions can be nested. Each macro definition can contain other macro instantiations and a given macro can be used an unlimited number of times. Macro recursion, that is, a macro that contains an instantiation of itself or instantiates another macro ultimately leading to instantiation of itself, is not permitted. In the described embodiment, a macro definition is defined as a pair of VHDL comments which encapsulate or "sandwich" the microcode segment and is of the form:

-- START MUCODE macro_name

<segment of microcode>

-- END MUCODE macro_name wherein -- START MUCODE macro_name marks the start of a macro definition, -- END MUCODE macro_name marks the end of a macro definition, macro_name is the name of the macro and <segment of microcode> represents the microcode segment to be substituted in place of a macro instantiation.

Figure 2:
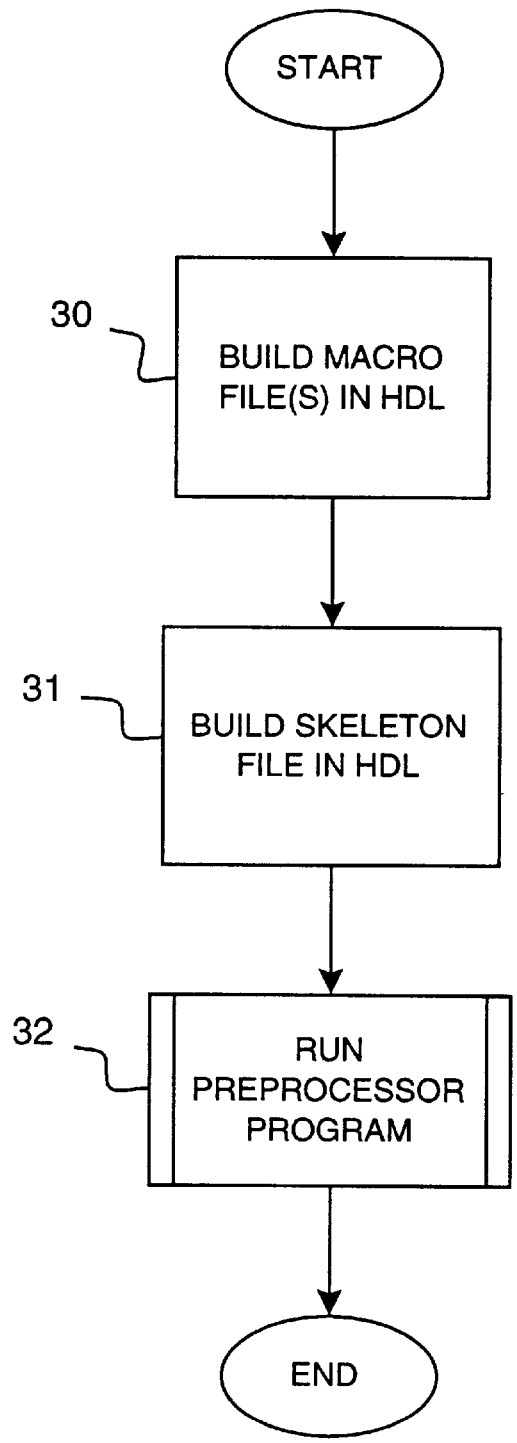
FIG. 2 is a flow diagram of a method for generating a hardware description language source code file for describing control logic of a complex digital system in accordance with the present invention.

Referring to FIG. 2, a flow diagram of a method for generating a hardware description language source code file 15 for describing the control logic of the complex digital system and in accordance with the present invention is shown. Its purpose is to build the necessary input hardware description language files and combine them into a final hardware description language output file. The method involves performing three basic steps. First, one or more of the macro files 13, as described above, are "built," that is, written in a hardware description language and stored as a file in a computer system (block 30). Second, a skeleton file 12, as described above, is built (block 31). Finally, the preprocessor program 14, whose operation is described in FIG. 3 et seq., is executed to combine the skeleton file 12 with the one or more macro files 13 to form the output file 15 (block 32).

Figure 3:
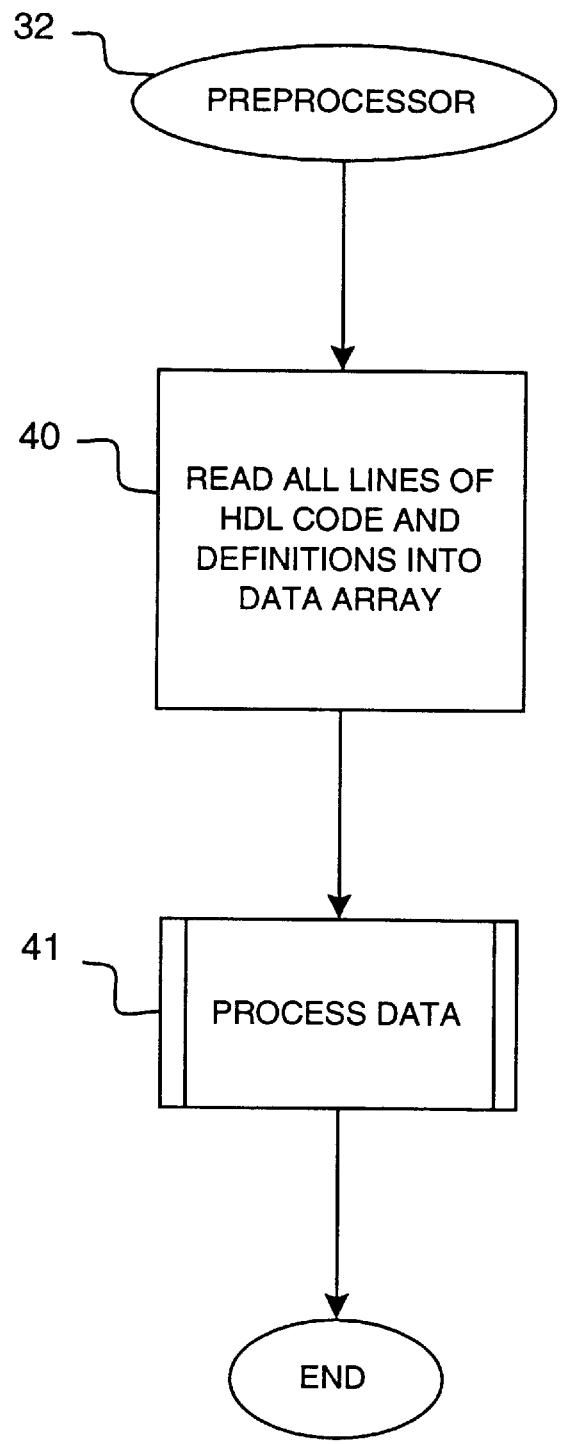
FIG. 3 is a flow diagram describing the operation of the preprocessor of FIG. 2.

Referring to FIG. 3, a flow diagram describing the operation of the preprocessor 14 (block 32) is shown. Its purpose is to read in the skeleton file 12 and macro files 13 and combine them to form the output file 15. First, all lines of hardware description language source code, including comments, program text and definitions, are read from the skeleton file 12 and macro files 13 and stored into an internal data array in the computer memory (block 40). Second, a data processing routine, as further described below and shown in FIG. 4 et seq., is called to process the data array line-by-line to form the output file 15 (block 41). Upon the completion of preprocessing, the output file 15 contains a complete hardware description language description of the control logic for the complex digital system with all macro instantiations replaced by segments of microcode.

The source code for the preprocessor 14 for the described embodiment is included as the APPENDIX to this specification. It is written in the PERL programming language, although any general purpose programming language, such as the C programming language, is equally suitable. The preprocessor 14 accepts as inputs a skeleton file 12 and macro files 13 written in VHDL and outputs a output file 15 also written in VHDL, although other hardware description languages, such as Verilog HDL, are equally acceptable. In the described embodiment, the preprocessor 14 is invoked by specifying a program name followed by a list of the names of the macro files 13, the name of the skeleton file 12 and the name of the output file 15.

Figure 4:
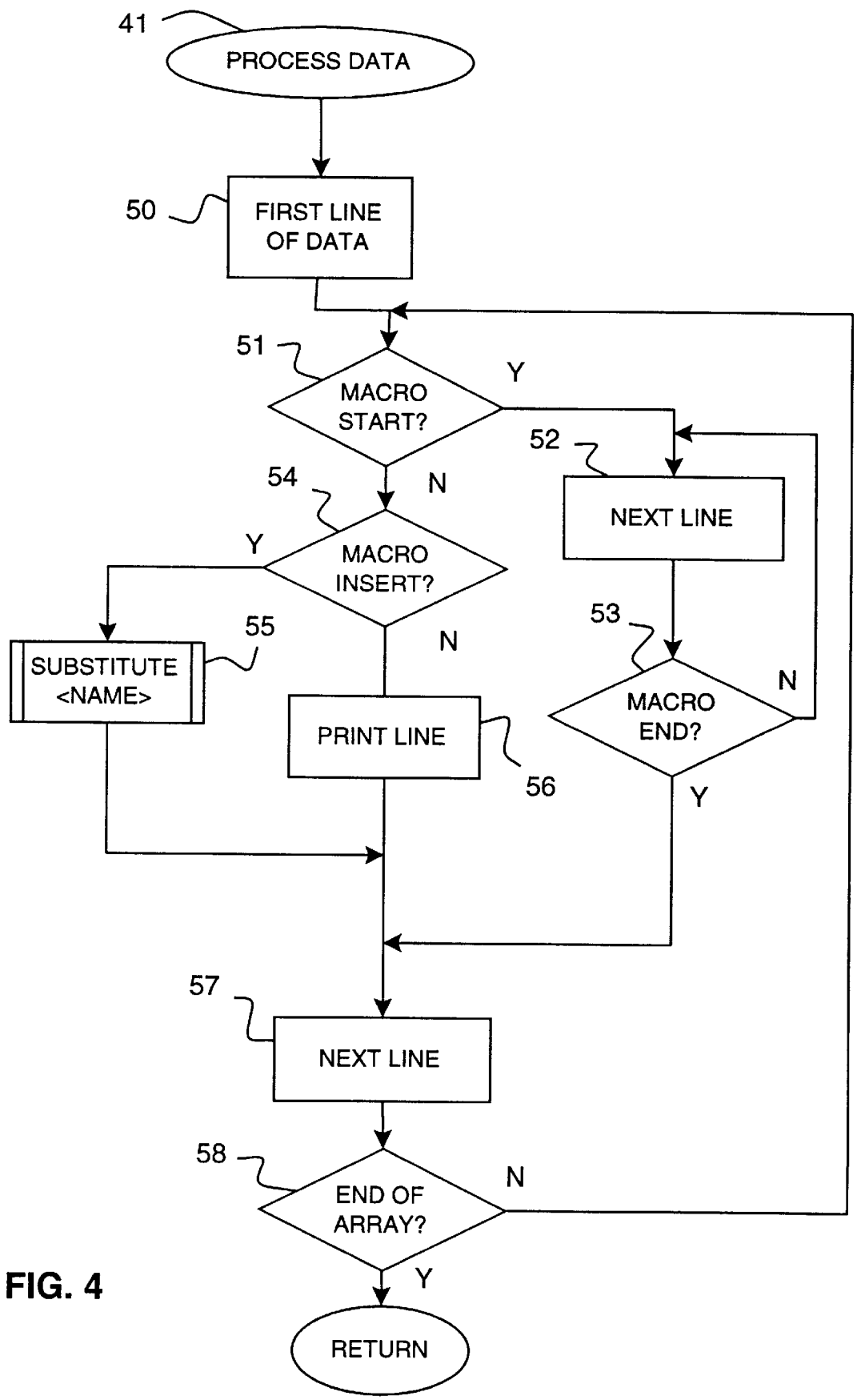
FIG. 4 is a flow diagram of a routine for processing a data array in the process shown in FIG. 3.
Figure 5:
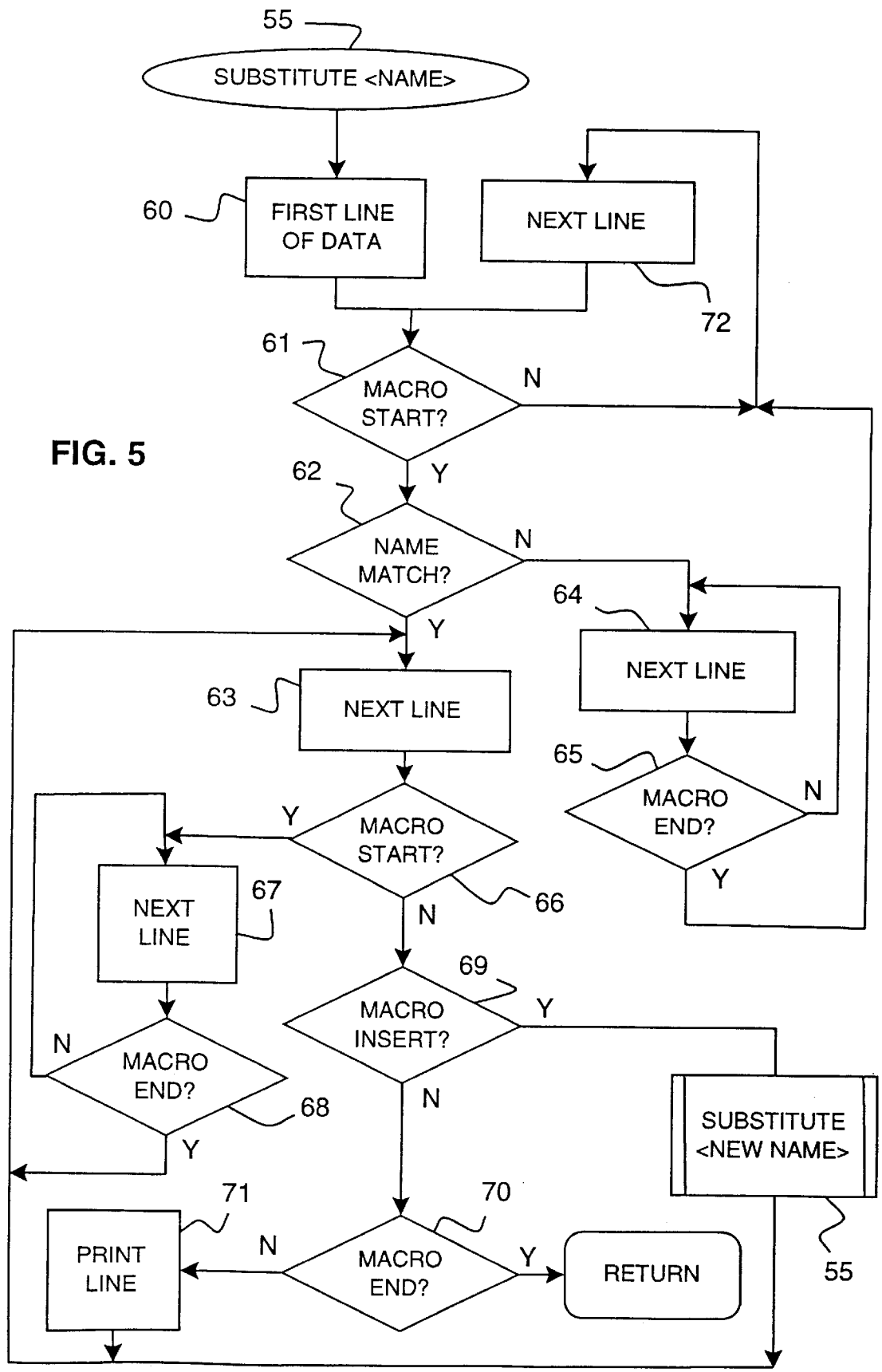
FIG. 5 is a flow diagram of a routine for substituting a macro instantiation with a macro definition in the subprocess shown in FIG. 4.

Referring to FIG. 4, a flow diagram of the routine for processing the data array (block 41 in FIG. 3) is shown. Its purpose is to analyze each line of data stored in the data array and to filter out macro definitions and instantiations. A first line of data is obtained from the data array (block 50). The control loop (blocks 51–58) begins. If the line of data represents the start of a macro definition (block 51), the next line of data is repeatedly read from the data array (block 52) until the end of the macro definition is encountered (block 53). Otherwise, if the start of a macro definition was not encountered (block 51), yet the line of data instead represents a macro instantiation (block 54), a routine for substituting the macro instantiation with a macro definition, as further described below in FIG. 5, is called, passing the macro name as an input argument (block 55). If the start of a macro definition is not encountered (block 51) and the line of data is not a macro instantiation (block 54), the line of data is printed out to the output file 15 (block 56). In this manner, macro definitions and instantiations are filtered out from the output file 15. The next line of data is obtained from the data array (block 57). If the end of the data array has not been encountered (block 58), execution continues at the top of the control loop (blocks 51–58) to begin processing the next line of data. Otherwise, if the end of the data array has been encountered (block 58), the routine returns.

Referring to FIG. 5, a flow diagram for the routine for substituting a macro instantiation with a macro definition (block 55 in FIG. 4) is shown. Its purpose is to substitute each macro instantiation encountered with an associated segment of microcode. The first line of data is obtained from the data array (block 60). The first control loop (blocks 61–65) begins. If the line of data is the start of a macro definition (block 61) and the macro name passed as an argument from the calling routine matches the name of the macro definition (block 62), the next line of data is obtained from the data array (block 63). Otherwise, if the line of data is not the start of a macro definition (block 61), the next line of data is obtained from the data array (block 72) and execution continues at the top of the first control loop (blocks 61–65).

If the line of data is the start of a macro definition (block 61), yet the macro name does not match the name of the instantiation (block 62), the next line of data is repeatedly read from the data array (block 64) until the end of the macro definition with a macro name that matches the name of the instantiation is encountered (block 65). Once the matching end of the macro definition is encountered (block 65), the next line of data is read from the data array (block 72) and execution resumes at the top of the first control loop (block 61–65). If the macro name matches the name of the instantiation (block 62), the second control loop (blocks 66–69) begins and the next line of data is read from the data array (block 63). If the next line of data is itself the start of a macro definition (block 66), a nested macro definition has been encountered and the next line of data is repeatedly read from the data array (block 67) until the matching end of the macro definition is encountered (block 68). Once the end of the macro definition is encountered (block 68), the next line of data is read from the data array (block 63) and execution continues at the top of the second control loop (blocks 66–69). If the start of a macro definition is not encountered (block 66), yet a macro instantiation is encountered (block 69), a nested macro instantiation has been encountered and the present routine is recursively called for processing the macro instantiation, passing the macro name as an input argument (block 55). Otherwise, if a macro instantiation is not encountered (block 69), yet the end of a macro definition has not been encountered (block 70), the routine is still within the body of the macro definition and the current line of data is printed out to the output file 15 (block 71). Otherwise, if the end of the macro definition has been encountered (block 70), the routine returns.

By employing encapsulated segments of microcode, a designer can fine tune the operation of each segment without the added complication of searching through a large hardware description language source code file to make changes in every occurrence of the microcode segment. During the design process, the designer initially writes a skeleton file and macro files in a hardware description language containing macro instantiations and macro definitions. These are submitted to the preprocessor which replaces all macro instantiations with a microcode segment from the corresponding macro definition to form a final output hardware description language source code file. The designer can revise the skeleton and macro files and iteratively resubmit them to the preprocessor until a satisfactory representation of the control logic for the complex system has been realized.

Having described and illustrated the principles of the invention in a preferred embodiment thereof, it should be apparent that the invention can be modified in arrangement and detail without departing from such principles. I claim all modifications and variations coming within the spirit and scope of the following claims.

---

APPENDIX: Preprocessor: PERL source code
\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*

```perl
#!/usr/local/bin/perl -w
# Copy argument list into filename array
# Read files intoline array
if ($#ARGV == -1) {
    @DATA = <STDIN>;
}
else {
    $i = 0;
    foreach $F(@ARGV) {
        # print STDERR $F, "\n";
        open (FILE, $F) || die "Cannot open file", $F, "\n";
        while (<FILE>) {
            $DATA[$i] = $_;
            $i ++;
        }
    }
}
# $VHDL = "VHDL";
# open($VHDL, ">foo.vhd") || die "Can't open VHDL output file.\n";
$VHDL = "STDOUT";
$NEXT = 0;
foreach $L (@DATA) {
    # First strip out unwanted macro definitions from output
    if ($L =~ /-- END/) {
        if ($NEST > 0) {
            $NEST --;
        }
    }
    elsif ($L =~ /-- START/) {
        $NEST ++;
    }
    elsif ($NEST > 0) {
    }
```

-continued

```
    elsif ($L =~ /([ ]*)-- INSERT (.*)/) {
        #Substitute this line with the appropriate code block
        #from the instructions file
        $BLANK_LEADER = $1;
        #First extract the string to look for in the DATA array
        $SEARCH_FOR = $2;
        #print STDERR $SEARCH_FOR, "\n";
        $RVAL = &substitute ($SEARCH_FOR, $BLANK_LEADER);
        if ($RVAL != 0) {
            print STDERR "ERROR: Could not find <", $SEARCH_FOR,
">\n"
        }
    }
    else {
        print $VHDL $L;
    }
sub substitute {
    # Search the DATA array for the macro called $SEARCH_FOR,
    # and print in in the output stream
    local (@ARGS) = @_;
    local ($SEARCH_FOR) = $ARGS[0];
    local ($BLANK_LEADER) = $ARGS[1];
    local ($RVAL) = 0;
    * For each line of the lines array
    local ($IX) = 0;
    while ($IX <= $#DATA) {
        $LINE = $DATA[$IX];
        # Looking for --START
        if ($LINE =~/-- START (.*)/ {
            # print STDERR "<", $1, ">";
            # print STDERR "Found a START\nLooking for <",
$SEARCH_FOR, ">\n";
            if ($1 eq $SEARCH_FOR) {
                # print STDERR "Found", $SEARCH_FOR, "\n";
                print $VHDL $BLANK_LEADER; print $VHDL $LINE;
                # Found start of block we are looking for
                #Now copy block until "-- END" is seen
                while (1) {
                    # If a nested INSERT statement, call SUBSTITUTE
function recursively
                    #else, just echo line
                    $IX ++;
                    $LINE = $DATA[$IX];
                    if ($LINE =~ /([ ]*)-- INSERT (.*)/) {
                        local($NEW_BLANK_LEADER) = $BLANK_LEADER.
$1;
                        local($NEW_SEARCH_FOR) = $2;
                            # print STDERR "calling substitute
recursively!\n";
                        $RVAL = &substitute($NEW_SEARCH_FOR,
$NEW_BLANK_LEADER);
                        if ($RVAL != 0) {
                            print STDERR "ERROR: Could not find <",
$NEW_SEARCH_FOR, ">, overall line\n"
                        }
                    }
                    elsif ($LINE =~ /-- START/) {
                        print STDERR "Error in input data, overall
line ", $IX, "\n.";
                        return 1;
                    }
                    else {
                      # This line strips out leading blanks in the
macro definition
                        # $LINE =~ s/[ ]*(.*)/\1/;
                            print $VHDL $BLANK_LEADER; print $VHDL
$LINE;
                        if ($LINE =~ /-- END/) {
                            return 0;
                        }
                    }
                }
            }
        }
        $IX ++;
    }
    return 1;
}
```

I claim:

1. A computer system for designing control logic for a complex digital system represented in a hardware description language, comprising:

a computer, including a central processing unit, a memory, and a user input and output interface, including an input device for inputting commands to the central processing unit;

a macro file stored in the memory of the computer system and comprising source code written in the hardware description language and a macro name associated with a segment of the source code in the macro file;

a skeleton file stored in the memory of the computer system and comprising source code written in the hardware description language, the skeleton file including a reference to the macro name;

means for referencing and accessing the stored macro file and stored skeleton file using the computer responsive to an input command received from the input device;

means for invoking a preprocessor for execution with the central processing unit responsive to a further input command received from the input device, the preprocessor referencing and accessing the stored macro file and stored skeleton file; and means for combining the skeleton file with the segment of the source code from the macro file at the reference to the macro name using the preprocessor to form a final source code file stored in the memory of the computer system.

2. A computer system according to claim 1, wherein the user input and output interface further comprises a display device, the system further comprising:

means for reviewing the final source code file using the display device.

3. A computer system according to claim 1, the system further comprising:

means for referencing and accessing the stored final source code file with the central processing unit responsive to an input command received from the input device;

means for invoking a compiler for execution with the central processing unit responsive to a further input command received from the input device, the compiler referencing and accessing the stored final source code file; and means in the compiler for compiling the stored final source code file into a format usable by a simulator/tester.

4. A computer system according to claim 1, the system further comprising:

means for referencing and accessing the stored final source code file with the central processing unit responsive to an input command received from the input device;

means for invoking a compiler for execution with the central processing unit responsive to a further input command received from the input device, the compiler referencing and accessing the stored final source code file; and means in the compiler for compiling the stored final source code file into a net list for use with a synthesizer.

5. A computer system according to claim 1 further comprising:

one or more additional macro files, each additional macro file comprising additional source code written in the hardware description language and an additional macro name associated with a segment of the additional source code in the additional macro file.

6. A computer system according to claim 1, wherein the macro file stored in the memory of the computer system further comprises source code written in the hardware description language and one or more macro names associated with different segments of the source code in the macro file.

7. A method using a computer system for building a hardware description language representation of control logic for a complex digital system, comprising the steps of:

first, defining an operation to be performed by the complex digital system;

second, forming a segment of microcode represented in hardware description language source code for performing the operation as control logic;

third, constructing a macro definition comprising a macro name associated with the segment of microcode, the macro name delimiting a beginning and an ending of the segment of microcode;

fourth, storing the macro definition in a macro file in the computer system;

fifth, defining an interface to the complex digital system represented in hardware description language source code;

sixth, defining a structure for the control logic for the complex digital system represented in hardware description language source code, the structure including a reference to the macro name also represented in hardware description language source code;

seventh, storing the interface and the structure in a skeleton file in the computer system;

eighth, locating the reference to the macro name in the skeleton file;

ninth, obtaining the macro definition from the macro file;

tenth, replacing the reference to the macro name in the skeleton file with the segment of microcode from the macro definition from the macro file to form a output file; and eleventh, storing the output file in the computer system for use in simulation, testing or fabrication of the complex digital system.

8. A method according to claim 7, wherein the computer system performs a definition operation for defining microcode fields, a default assignment operation for assigning default values to each of the microcode fields and a connection operation for connecting each of the microcode fields to the interface, the step of defining a segment of microcode further comprising:

defining a definitions segment of microcode for the definition operation, the default assignment operation and the connection operation.

9. A method according to claim 7, wherein the interface to the complex digital system comprises one or more input ports for receiving input signals, the step of defining the interface further comprising:

specifying the one or more input ports as microcode addresses which together constitute a segment of microcode.

10. A method according to claim 7, wherein the interface to the complex digital system comprises one or more output ports for sending output signals, each of the output ports having a set of attributes, the step of defining the interface further comprising:

specifying the one or more output ports as a segment of microcode; and associating the set of attributes with each of the one or more output ports, each attribute being specified as a segment of microcode.

11. A method according to claim 7, in which the step of defining a segment of microcode further comprises including with the segment of microcode a reference to a nested macro name, also represented in hardware description language source code, that is unique from the macro name associated with the segment of microcode.

12. A method according to claim 7 further comprising assembling a collection of macro files by repeating:

the first step of defining an operation to be performed by the complex digital system;

the second step of forming a segment of microcode represented in the hardware description language source code for performing the operation as control logic;

the third step of constructing a macro definition;

the fourth step of storing the macro definition in a macro file;

the sixth step of defining a structure for the control logic for the complex digital system represented in the hardware description language source code, further including a reference to at least one macro name from each of the macro files in the collection;

the eighth step of locating the reference to the macro name in the skeleton file, further comprising locating the references to each macro name in the skeleton file;

the ninth step of obtaining the macro definition, further comprising obtaining the macro definition for each macro referenced in the skeleton file from the macro file in which it was stored; and the tenth step of replacing the reference to the macro name in the skeleton file with the segment of microcode from the macro definition from the macro file, further comprising replacing the reference to each macro name in the skeleton file with the segment of microcode from the macro definition from the macro file in which it was stored.

13. A method for generating a hardware description language source code file for describing control logic of a complex digital system, the method comprising the steps of:

defining a macro file comprising source code written in a hardware description language and a macro name associated with a segment of the source code in the macro file;

defining a skeleton file comprising source code written in the hardware description language and including a reference to the macro name; and combining the skeleton file with the segment of the source code from the macro file at the reference to the macro name using a preprocessor to form a final source code file.

14. A method according to claim 13, the method further comprising the step of:

assembling a collection of macro files by repeating the first step of defining the macro file, the second step of defining the skeleton file further including a reference to at least one other macro name from each of the macro files in the collection, and the step of combining further comprising combining the skeleton file with the associated segment of the source code from each of the macro files in the collection.

15. A method according to claim 13, wherein the second step of defining the skeleton file further comprises:

defining an interface to the complex digital system; and describing an architecture representing the behavior of the complex digital system.

16. A method according to claim 15, the step of defining the interface further comprises the steps of:

specifying a set of input ports for the interface to the complex digital system;

specifying a set of output ports for the interface to the complex digital system; and specifying a set of attributes associated with each such input port and each such output port for the interface to the complex digital system, each of the set of input ports, the set of output ports and the set of attributes being embodied in microcode.

17. A method according to claim 15, wherein the step of describing the architecture further comprises the step of:

defining a set of functions that form a structure representing the control logic of the complex digital system.

18. A method according to claim 13, wherein the control logic of the complex digital system comprises an instruction group, the method further comprising the step of:

forming a segment of the source code for the instruction group.

19. A method according to claim 18, wherein the first step of defining a macro file further comprises:

storing the segment of the source code for the instruction group in the macro file.

20. A method according to claim 18, wherein the second step of defining the skeleton file further comprises:

storing the segment of the source code for the instruction group in the skeleton file.

21. A method according to claim 13, wherein the second step of defining the skeleton file further comprises including a conditional statement comprising the reference to the macro name, and the combining step further comprises:

analyzing the conditional statement of the skeleton file; and inserting the code segment associated with the macro name if the condition is satisfied.

22. A method according to claim 13, wherein the second step of defining the skeleton file further comprises including a definitions macro name for defining program variables.

23. A method according to claim 13, wherein the second step of defining the skeleton file further comprises including a defaults macro name for defining initial values assigned to program variables.

24. A method according to claim 13, wherein the second step of defining the skeleton file further comprises including a connections macro name for connecting microcode fields to outgoing microcode words.

* * * * *